United States Patent
Kim

(10) Patent No.: US 6,459,115 B1
(45) Date of Patent: Oct. 1, 2002

(54) SEMICONDUCTOR MEMORY CAPACITOR WITH INTRA-DIELECTRIC CONDUCTIVE SIDEWALL SPACER

(75) Inventor: Sung-Hoan Kim, Suwon (KR)

(73) Assignee: Samsung Electronics Co., Ltd., Hwasung (KR)

( * ) Notice: Subject to any disclaimer, the term of this patent is extended or adjusted under 35 U.S.C. 154(b) by 14 days.

(21) Appl. No.: 09/694,730

(22) Filed: Oct. 23, 2000

(30) Foreign Application Priority Data

Oct. 22, 1999 (KR) ............................................. 99-46051

(51) Int. Cl.$^7$ ............................................. H01L 27/108
(52) U.S. Cl. ........................ 257/304; 257/300; 257/303; 257/306; 257/311; 438/250; 438/393; 438/244; 438/253
(58) Field of Search ................................. 257/296, 300, 257/303, 304, 306, 311; 438/238, 239, 386, 399, 250, 393, 244, 253, 387, 396

(56) References Cited

U.S. PATENT DOCUMENTS

| | | | | |
|---|---|---|---|---|
| 5,903,430 A | * | 5/1999 | Takaishi | 361/301.4 |
| 5,953,608 A | * | 9/1999 | Hirota | 438/253 |
| 5,969,381 A | * | 10/1999 | Zenke | 257/308 |
| 6,265,261 B1 | * | 7/2001 | Kim et al. | 438/253 |

FOREIGN PATENT DOCUMENTS

| | | | | |
|---|---|---|---|---|
| JP | 02094554 A | * | 4/1990 | 257/306 |
| JP | 02094561 A | * | 4/1990 | 365/150 |

* cited by examiner

*Primary Examiner*—Nathan J. Flynn
*Assistant Examiner*—Scott R. Wilson
(74) *Attorney, Agent, or Firm*—Marger Johnson & McCollom, P.C.

(57) ABSTRACT

A capacitor of a semiconductor memory device includes a substrate having a cell pad exposed through a buried contact hole of an interlayer insulating layer; a storage electrode having a bar pattern formed on the interlayer insulating layer for making an electrical connection with the cell pad through the buried contact hole and conductive spacers formed on the side walls of the bar pattern; a dielectric layer formed on the storage electrode; and a plate electrode formed on the storage electrodes with the dielectric layer being between the storage electrode (including the spacers) and the plate electrode. Even if the storage electrode formed in the buried contact hole is partially exposed due to a misalignment between the bar pattern of the storage electrode and the buried contact hole, causing an etched groove to be formed at the periphery of the storage electrode exposed by the over-etching process, the conductive spacer fills in the etched groove to thereby increase the breakdown voltage of the dielectric layer of the storage electrode. In addition, in the following processes for forming the dielectric layer and plate electrode, the bar pattern of the storage electrode does not collapse and the buried contact resistance does not get higher between the bar pattern of the storage electrode and cell pad. Yield of the semiconductor memory device is improved.

10 Claims, 4 Drawing Sheets

SEMICONDUCTOR MEMORY CAPACITOR WITH INTRA-DIELECTRIC CONDUCTIVE SIDEWALL SPACER

BACKGROUND OF THE INVENTION

1. Field of the Invention

The present invention relates to a capacitor of a semiconductor memory device, and more particularly to a capacitor of a semiconductor memory device and a method for fabricating the capacitor of the semiconductor memory device which is not to be affected by misalignment of storage electrode and buried contact hole, but reinforces breakdown voltage of a dielectric layer formed between the storage electrode and a plate electrode.

2. Description of the Prior Art

In general, as the density of memory cells increases to improve integration degree of a semiconductor device like a DRAM, the size of memory cells have decreased according to the tendency of high integration. The reduction in the size of the memory cells directly results in reduction in capacitance of a capacitor. Thus, in order to achieve high integration of the semiconductor memory device, it is required that density of the memory cells should be increased along with the increase in capacitance of the capacitor. Since the increase in the capacitance of the capacitor improves the read-out capability of memory cells and reduces errors in the software system, a lot of research efforts have been concentrated on developing methods for increasing capacitance of the capacitor. Most of the research has focused on the structure of a storage electrode to make up the capacitor of the memory cells, such as a pin-shaped electrode made in Fujitsu Co., a box-structured electrode made in Toshiba Co., cylindrical-shaped electrode made in Mitsubishi Co. and the like. An attempt to increase the capacitance of the capacitor through an improvement made in the structure of the storage electrode has been made difficult due to a number of problems like limitations in designs, increase in process variations caused by complex fabricating processes, and the like. Therefore, in order to solve the aforementioned problems, it has been urgently demanded to develop a new method for fabricating the capacitor of the semiconductor memory device.

Recently, a lot of attention has been made to a capacitor over bit line (COB) structure of memory cells which are known to be suitable to 64 mega DRAM or 256 mega DRAM. In order to increase the density of the COB structure of memory cells, the pitch of the storage electrode has been reduced along with the reduction in the size of the buried contact hole. However, as there are limitations in the conventional fabricating processes to reduce the size of the buried contact hole, there has been provided a process of flowing a photo resist layer or an improvements in a method for etching an interlayer insulating layer. In other words, in case of the process of flowing a photo resist layer, a pattern of a photo resist layer having an aperture larger than the dimension of the buried contact hole to be formed, is formed on an interlayer insulating layer, and the pattern of the photo resist layer is used as a mask to form an etched groove by etching the interlayer insulating layer to a predetermined depth. Then, the pattern of the photo resist layer in an ADI (as development inspection) state is flowed in a predetermined width between a lower edge part and the lower middle part. Then the patterned flowed photo resist layer is used as a mask to etch the interlayer insulating layer exposed within the etched groove to expose a cell pad below. As a result, a desirably smaller buried contact hole is formed. However, after the patterned flowed photo resist layer is used as a mask for vertically etching the exposed portion of the interlayer insulating layer, a top critical dimension (CD) of the buried contact hole gets small but the middle and bottom CDs of the buried contact hole get large. Accordingly, the margin between the buried contact hole and the bit line gets smaller to deteriorate electrical insulation between the bit line and the storage electrode. Such may bring about defects in performances of the semiconductor memory device and reduction in the yield of products.

In order to solve the aforementioned problems, the pattern of the flowed photo resist layer is used as a mask to perform a slant etching process, instead of the vertical etching process, to the exposed portion of the interlayer insulating layer to expose the cell pad below. As a result, the top CD of the buried contact hole gets large, but the middle and bottom CDs of the buried contact hole get small. Accordingly, the margin between the buried contact hole and bit line gets larger, thereby improving the performance of the semiconductor memory device and increasing yield. However, it is very possible for the cell pad not to get exposed due to the smaller bottom CD, so that it gets more difficult to make an electrical connection between storage electrode and cell pad. Therefore, in order to enlarge the bottom CD of the buried contact hole, developments have been made to get the top CD as large as possible within the permitted limit of the fabricating processes.

A capacitor of the conventional type, as shown in FIG. 1, is constructed with a field oxide layer 11 at a field region of a P type silicon substrate 10, with the source S of N-type expansion region within the active region between the adjacent field oxide layer 11 regions. The polysilicon layer of cell pad 40 is above the source S and the interlayer insulating layer 50 having a planarized surface extends across the silicon substrate 10. The thickness of layer 50 is greater than the height of an upper surface of the cell pad 40. A bit line 60 is formed higher than the upper surface of the cell pad 40 in the interlayer insulating layer 50 between cell pads 40. A bar pattern 70 of the storage electrode is formed on the interlayer insulating layer 50 for making an electrical connection through the buried contact hole 53 with the cell pad 40. An Oxide/nitride/oxide (ONO)-structured dielectric layer 80, overlies the bar pattern 70 of the storage electrode, and then a plate electrode 90 is formed thereover, as shown. The bit line 60 is constructed with a polysilicon layer 61 and a silicide layer 63 formed on top of the polysilicon layer 61 to reduce resistance of the polysilicon layer 61.

In the memory cells thus constructed, a polysilicon layer acting as a conductive layer for the storage electrode is deposited on the interlayer insulating layer 50 having a buried contact hole 53. This exposes the upper surface of the cell pad 40 for filling in the buried contact hole 53 and provides a predetermined thickness suitable for formation of the bar pattern 70 of the storage electrode. In order to form the bar pattern 70 of the storage electrode, the unneeded part of the polysilicon layer is etched to expose the interlayer insulating layer 50 below. Afterwards, an additional over-etching process is performed to the polysilicon layer to secure electrical isolation between the bar pattern 70 of the storage electrode.

However, even if misalignment between the bar pattern of the storage electrode and the buried contact hole frequently happens, and the bar pattern 70 of the storage electrode often fails to completely cover the buried contact hole 53, but partially exposes the storage electrode in the buried contact hole 53. While the subsequent over-etching process is performed, an etched groove 71 is formed in a position of the storage electrode exposed in the buried contact hole 53. When it is deposited on the bar pattern 70, the dielectric layer 80 is not deposited uniformly in thickness within etched groove 71, thereby lowering the breakdown voltage and reducing the reliability of the capacitor.

Furthermore, the width of the storage electrode gets smaller at the upper part of the buried contact hole 53, lending the electrode mechanically weak. Therefore, in the course of the subsequent process steps for forming the dielectric layer 80 or the plate electrode 90, the physically narrow and thus somewhat fragile bar patterns 70 of the storage pattern collapse. Even if one or more bar patterns 70 of the storage electrode does not collapse, the buried contact resistance increases between the cell pad 40 and the bar pattern 70 of the storage electrode, thereby degrading the performances of the capacitor of the semiconductor memory device and, perhaps worse, reducing yield.

SUMMARY OF THE INVENTION

Therefore, it is an object of the present invention to provide a capacitor of a semiconductor memory device and a method for fabricating the capacitor, in spite of misalignment between storage electrode and buried contact hole, which can enhance the breakdown voltage of a dielectric layer formed between storage electrode and plate electrode.

It is another object of the present invention to provide a capacitor of a semiconductor memory device and a method for fabricating the capacitor that can prevent a bar pattern of a storage electrode from collapsing.

It is a further object of the present invention to provide a capacitor of a semiconductor memory device and a method for fabricating the capacitor that can reduce buried contact resistance between a bar pattern and a cell pad.

In order to accomplish the aforementioned object of the present invention, there is provided a capacitor of a semiconductor memory device comprises: a substrate having a cell pad exposed through a buried contact hole of an interlayer insulating layer; a storage electrode having a bar pattern formed on the interlayer insulating layer for making an electrical connection with the cell pad through the buried contact hole and conductive spacers formed on the side walls of the bar pattern; a dielectric layer formed on the storage electrode; and a plate electrode formed on the storage electrodes with the dielectric layer being inserted therein.

In order to accomplish the aforementioned object of the present invention, there is also provided a method for fabricating a capacitor of a semiconductor memory device comprising: preparing a substrate having a cell pad; forming an interlayer insulating layer having a buried contact hole to expose the cell pad over the substrate; forming a bar pattern of a storage electrode on the interlayer insulating layer for making an electrical connection with the cell pad through the buried contact hole; forming conductive spacers of storage electrode on side walls of the bar pattern; forming a dielectric layer on the storage electrode; and forming a plate electrode on all the storage electrodes with the dielectric layer being between the storage and plate electrodes.

Preferably, the spacer can be made of the same material as the bar pattern, a polysilicon layer, or another material. The width of the bottom of the spacer is made preferably over approximately 60 nm.

Therefore, even if an etched groove is formed at the bar pattern of storage electrode in the buried contact hole, the conductive spacers are formed on the side walls of the bar pattern of storage electrode to fill in the etched groove, thereby increasing breakdown voltage. In addition, the bar pattern does not collapse and the buried contact resistance does not get higher, consequently increasing yield.

BRIEF DESCRIPTION OF THE DRAWINGS

Objects and aspects of the invention will become apparent from the description of an embodiment with reference to the accompanying drawings in which.

DETAILED DESCRIPTION OF THE PRESENT INVENTION

Figure 1:
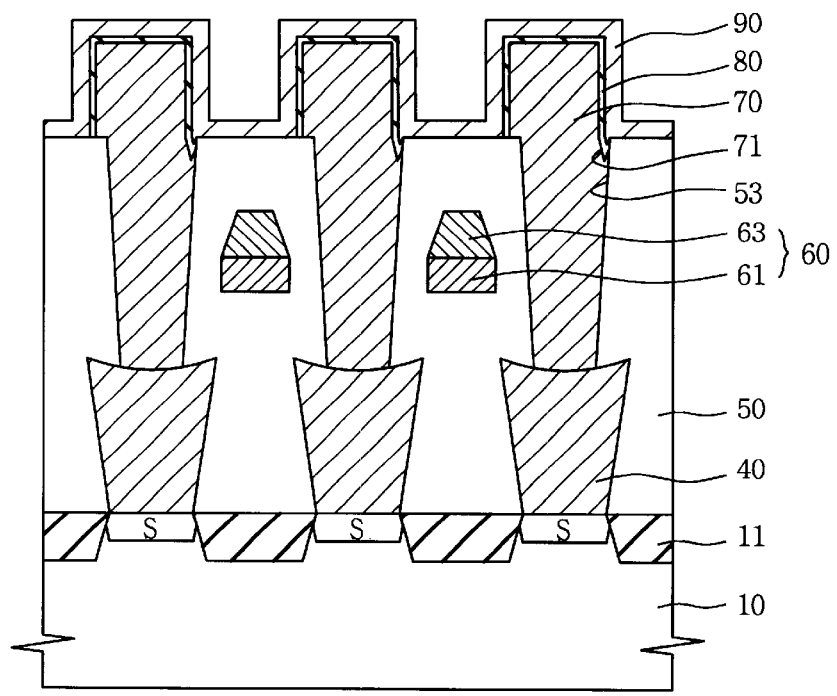
FIG. 1 is a cross-sectional view for illustrating a capacitor of a semiconductor device in accordance with the prior art.
Figure 2:
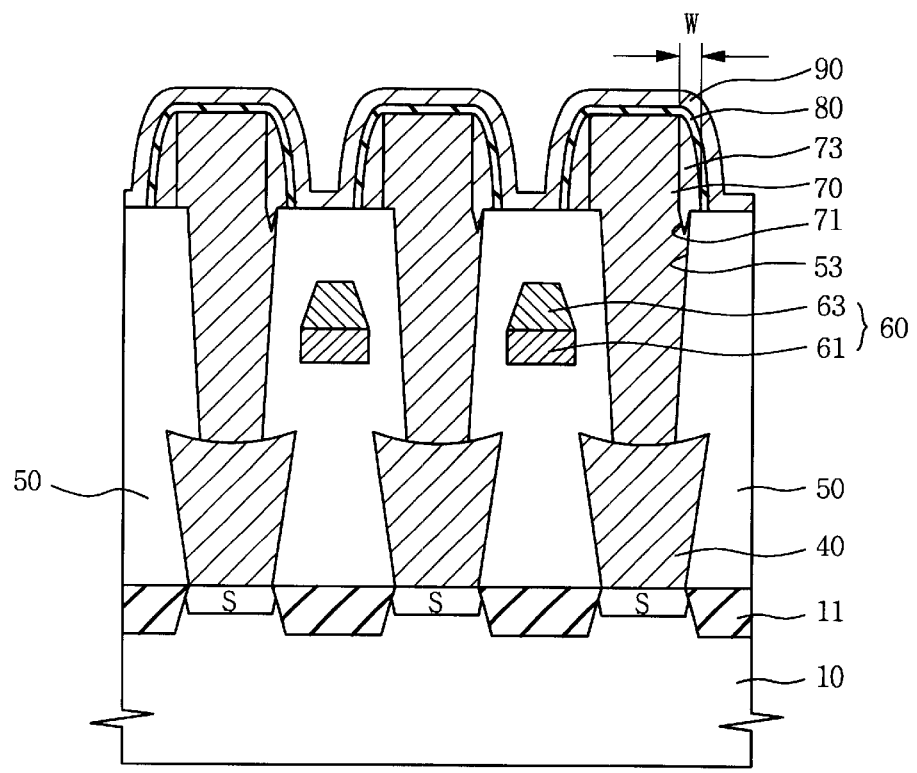
FIG. 2 is a cross-sectional view for illustrating a capacitor of a semiconductor device in accordance with the present invention.

Hereinafter, a capacitor of a semiconductor device and a method for fabricating a semiconductor device of the present invention will be described with reference to accompanying drawings. FIG. 2 is a cross-sectional view for illustrating a capacitor of a semiconductor memory device of the present invention. At this time, reference numerals and symbols designated for the same parts and functions of prior art FIG. 1 will be also used for the same parts and functions of the present invention. As shown in FIG. 2, a capacitor of a semiconductor memory device of the present invention comprises: field oxide layers formed in field region of a first conductive type of P-type silicon substrate 10; N+ expansion regions of sources S formed at active regions between the field oxide layer 11 regions; cell pads 40 formed on the sources S; planarized interlayer insulating layers 50 extending across the silicon substrate 10 to a height above that of the cell pads 40; bit lines 60 formed in predetermined positions at elevations higher than the top surface of the cell pads 40 in the interlayer insulating layers 50 between the cell pads; bar patterns 70 acting as storage electrodes formed on the interlayer insulating layer for an electrical connection with corresponding cell pads 40 through buried contact holes 53 of the interlayer insulating layers 50; conductive spacers 73 of the storage electrode formed on the side walls of the bar patterns 70; an ONO structure of dielectric layers 80 overlying the bar patterns 70 and the conductive spacers 73; and a plate electrode 90 deposited thereover.

The bitline 60 is made up of polysilicon layer 61 and silicide layer 63 positioned on the polysilicon layer 61 to reduce resistance of the polysilicon layer 61. The spacer 73 preferably is made of the same material as the bar patterns 70 that act as storage electrodes. Alternatively, it may be a polysilicon layer, or a different conductive material. Although the interlayer insulating layer 50 is illustrated as one layer, it can alternatively be formed with a plurality of other layers of different materials. Although not shown in the drawing, it will be understood that the bit line 60 is connected through a bit line contact hole formed in the interlayer insulating layer 50.

In the capacitor of a semiconductor memory device thus constructed, the bar pattern 70 of the storage electrode is formed in the height of 1 $\mu$m on the interlayer insulating layer 50. The bottom CD of the bar pattern 70 is 0.25 $\mu$m, and the top CD of the buried contact hole 53 is 0.23 $\mu$m. The overlapped margin between the bar pattern 70 and the buried contact hole 53 is 0.02 $\mu$m. Assume that the margin of error in the photo process of the bar pattern 70 is 80 nm. Then a misalignment may result between the bar pattern 70 of the storage electrode and the buried contact hole 53 within the permitted limits of the fabricating procedure. The bar pattern 70 of the storage electrode would not completely cover the buried contact hole 53, but would partially expose the storage electrode in the buried contact hole 53. Etched grooves 71 are then formed at parts of the storage electrode exposed in the buried contact hole 53 in the course of an additional over-etching process, as described in the prior art.

However, the conductive spacers 73 are formed at the side walls of the bar pattern 70 of the storage electrode, filling in the etched groove 71. Because the gap formed between the bar patterns 70 is 0.24 µm, it is preferable that the width of the lower portion of the spacer 73 is more than approximately 60 nm.

Therefore, in accordance with the present invention, the dielectric layer 80 is easily deposited on the surface of the bar pattern 70 of the storage electrode and the spacers 73, thereby preventing reduction of the breakdown voltage of dielectric layer 80 in the area of etched groove 71. Furthermore, the width of the storage electrode is kept the same, without getting smaller at the top part of the buried contact hole 53. This prevents the buried contact resistance of the bar pattern 70 of the storage electrode and the cell pad 40 from getting higher. It also prevents the bar pattern 70 of the storage electrode from collapsing. As a result, the capacitor of the semiconductor memory device of the present invention increases yield.

Next, the method for fabricating a capacitor of a semiconductor memory device will be described with reference to FIGS. 3A through 7 that illustrate sequential process steps for fabricating the capacitor in accordance with the present invention. Reference numerals and symbols designated for the same elements and functions in FIG. 2 will be used for corresponding elements of FIGS. 3A through 7.

Figure 3A:
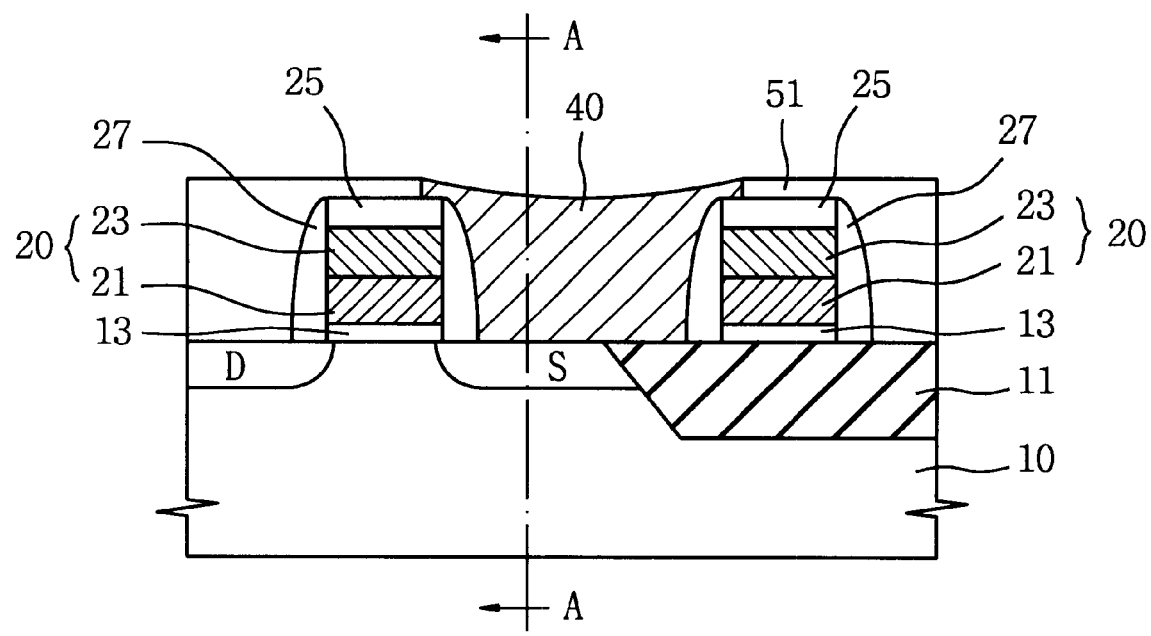
FIGS. 3A, 3B, 4, 5, 6 and 7 illustrate the procedure for fabricating a capacitor of a semiconductor device in accordance with the present invention.

As shown in FIG. 3A, the field oxide layer 11 is formed at the field region of the silicon substrate 10 to restrict the active region of the silicon substrate 10 using a shallow trench isolation (STI) process or local oxidation of silicon (LOCOS) process, and a gate oxide layer 13 is grown by a thermal oxidation process on the silicon substrate 10. Then, the conductive layer, for instance, the polysilicon layer 21, is deposited on the gate oxide layer 13 and field oxide layer 11, and the silicide layer 23, e.g. a tungsten silicide layer, is further deposited on top of the silicide layer 23 for reducing the resistance of the polysilicon layer 21. Then, an insulating layer 25 formed of nitride on its bottom and an oxide layer on its top is deposited on the silicide layer 23. Then, a photo etching process is performed for leaving some portions of the insulating layer 40 corresponding to word lines and removing the rest of the insulating layer 40 to expose the tungsten silicide layer 23. Next, the remaining patterns of the insulating layer 40 are used as masks to etch away the silicide layer 23 and the polysilicon layer 21 to expose the gate oxide layer 13 therebelow, thereby forming patterns of the gate electrode 20.

After completing the formation of the gate electrode 20, the gate electrode 20 is used as a mask for ion implanting an N type impurity like phosphorus at the active region of a transistor in a low density. Then, an insulating layer like an oxide layer is deposited thick over the silicon substrate 10, and an etch-back process is performed to expose the silicon substrate 10 of the active region, thereby forming the spacers 27 of the insulating layer on both walls of the gate electrode 20. Furthermore, the gate electrode 20 and the spacers 27 are used as a mask for ion-implanting phosphorus to the active region in a high density for forming source/drain S/D.

Those of skill in the art will understand that FIGS. 3B and 4 through 7 are taken along the lines A—A of FIG. 3A, and represent the invented capacitor fabricated in accordance with the invention.

Figure 3B:
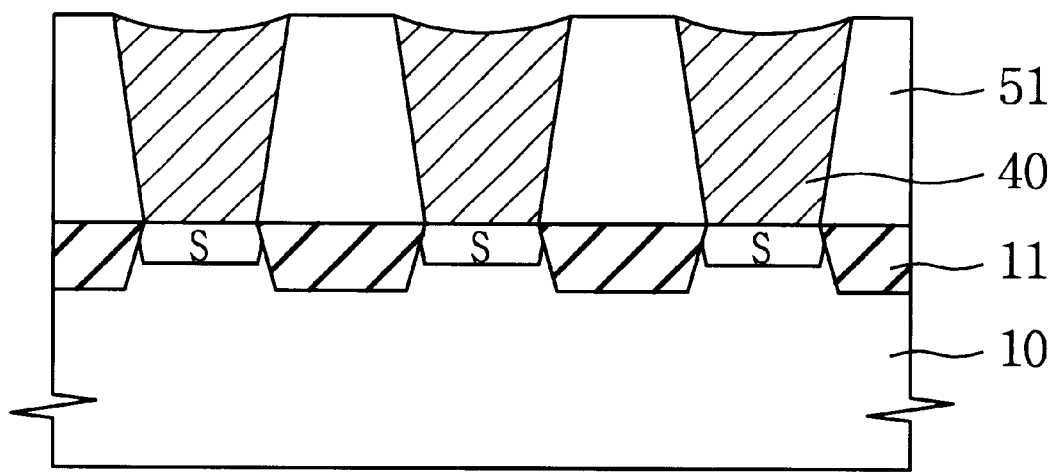

Referring now to FIG. 3B, an O3-TEOS CVD process is performed for depositing a first interlayer insulating layer 51 on the resulting structure to a predetermined thickness, for instance, thicker than the height of the cell pad 40 to be formed. Accordingly, a conventional planarizing process such as an etch-back process or chemical mechanical polishing (CMP) process is performed thereon to planarize with the height of the cell pad 40. Then, a portion of the first interlayer insulating layer 51 is etched to expose the source S, thereby forming a contact hole to form the cell pad 40. The conductive layer, for instance, a polysilicon layer, is deposited on the first interlayer insulating layer 51 thick enough to fill in the contact hole. The etch-back process is performed to remove the polysilicon layer formed on the first interlayer insulating layer 51. Therefore, the cell pad 40 is planarized with the first interlayer insulating layer, making an electrical connection with source S.

Figure 4:
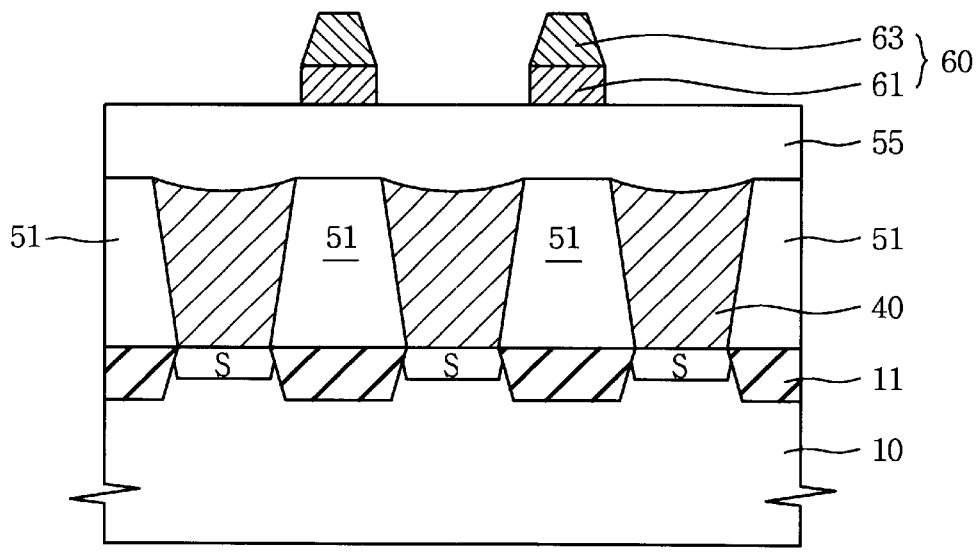

As shown in FIG. 4, after completing formation of the cell pad 40, the O3-TEOS CVD process is performed for depositing a second interlayer insulating layer 55 over the cell pad 40 and the first interlayer insulating layer 51 through which an electrical connection between the cell pad 40 and the bit line 60 is to be formed later, and the photo etching process is performed for forming a bit line contact hole (not shown) in a portion of the second and first interlayer insulating layers 55, 51 to expose a region of the drain D shown in FIG. 3A. Then, the conductive layer, e.g. a polysilicon layer 61 is deposited on the second interlayer insulating layer, 61 thick enough to fill in the bit line contact hole and, then, a silicide layer 63, e.g. a tungsten silicide layer, is deposited thereon to reduce resistance of polysilicon layer 61. A photo etching process is performed to make the silicide layer 63 and the polysilicon layer 61 in a pattern of bit line 60 extending between the cell pads.

Figure 5:
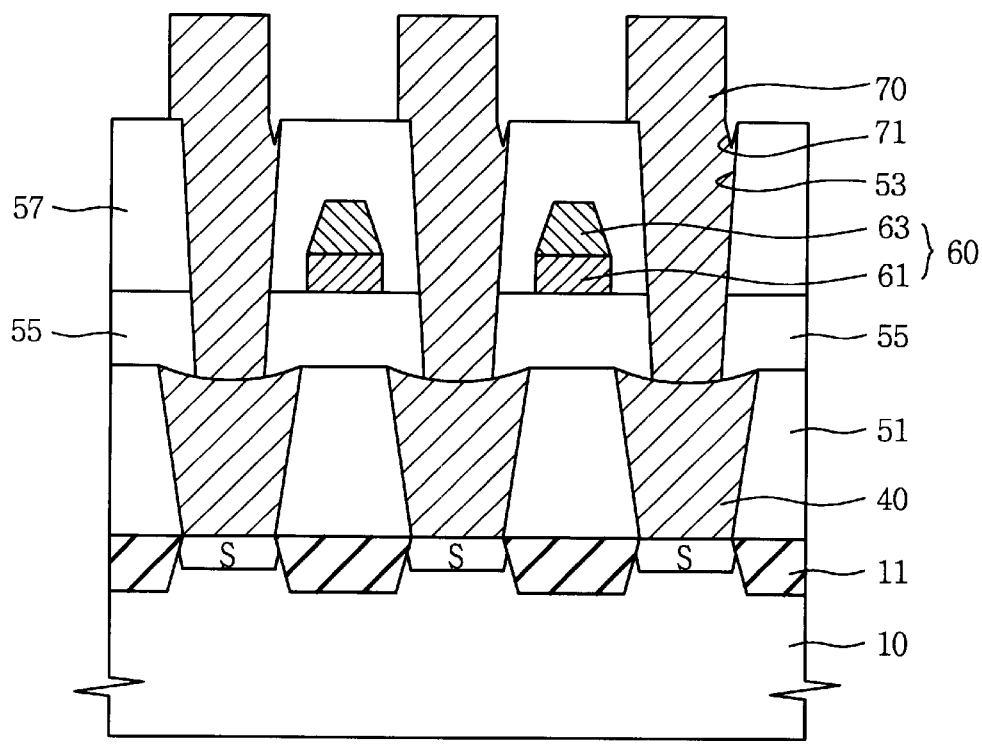

As shown in FIG. 5, after completing formation of the bit line 60, the O3-TEOS CVD process is performed for depositing a third interlayer insulating layer 57 over the bit line 60 and the second interlayer insulating layer 55, and then planarized through etch-back process or CMP process. At this time, in consideration of the bottom CD of the contact hole 53 to be formed at the third and second interlayer insulating layers 57, 55, it is preferable that the total thickness of the third and second interlayer insulating layer 57, 55 is made 8000 angstroms (Å).

Then, the photo etching process is performed to form buried contact hole 53 to expose the cell pad 40 in a portion of the third and second interlayer insulating layers 57, 55. At this time, it is common to perform a slant etching process to the third and second interlayer insulating layers 57, 55. Also, bar patterns 70 (acting as storage electrodes) are formed. As a detailed description thereof has been given above, it will not be repeated over again.

Figure 6:
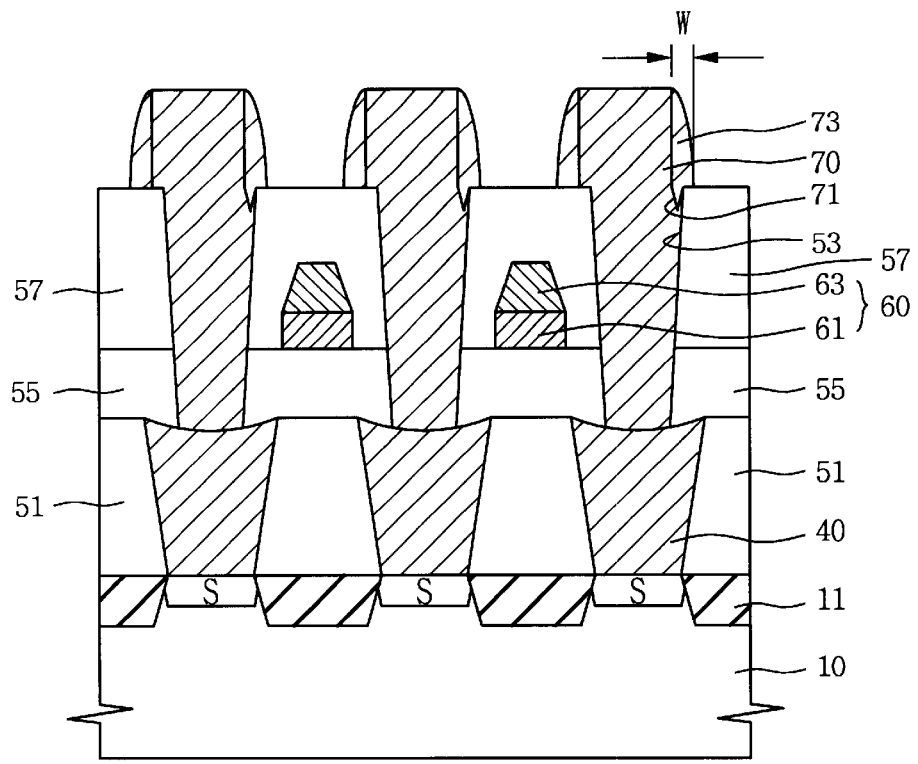

Turning now to FIG. 6, a conductive layer, e.g. a polysilicon layer, 73 is deposited on the third interlayer insulating layer 57 thick enough to completely fill in the buried contact hole 53 to be as thick as the height for the bar pattern 70 of the storage electrode, that is, 1 µm. The photo etching process is performed for forming the bar pattern 70 of the storage electrode. At this time, if there is a misalignment between the bar pattern 70 of the storage electrode and the buried contact hole 53 within the permitted limits of the fabricating procedure, the storage electrode formed in the buried contact hole 53 is partially exposed. Then, while the polysilicon layer is over-etched to guarantee electrical separation between the bar patterns 70 of the storage electrode, an etched groove 71 is formed at the storage electrode exposed at the buried contact hole 53, as shown.

As shown in FIG. 6, the conductive layer, for instance, a polysilicon layer, is deposited on the third interlayer insulating layer 57 including the bar pattern 70 of the storage electrode, and the etch-back process is further performed for forming the conductive spacers 73 of the storage electrode at both side walls of the bar pattern 70 of the storage electrode. It is preferable that the width of the lower portion of the spacer 73 is more than approximately 60 nm, as described in FIG. 2. The spacer 73 can be made of a polysilicon layer, the same material as the bar pattern 70 of the storage electrode, or of another conductive material.

Figure 7:
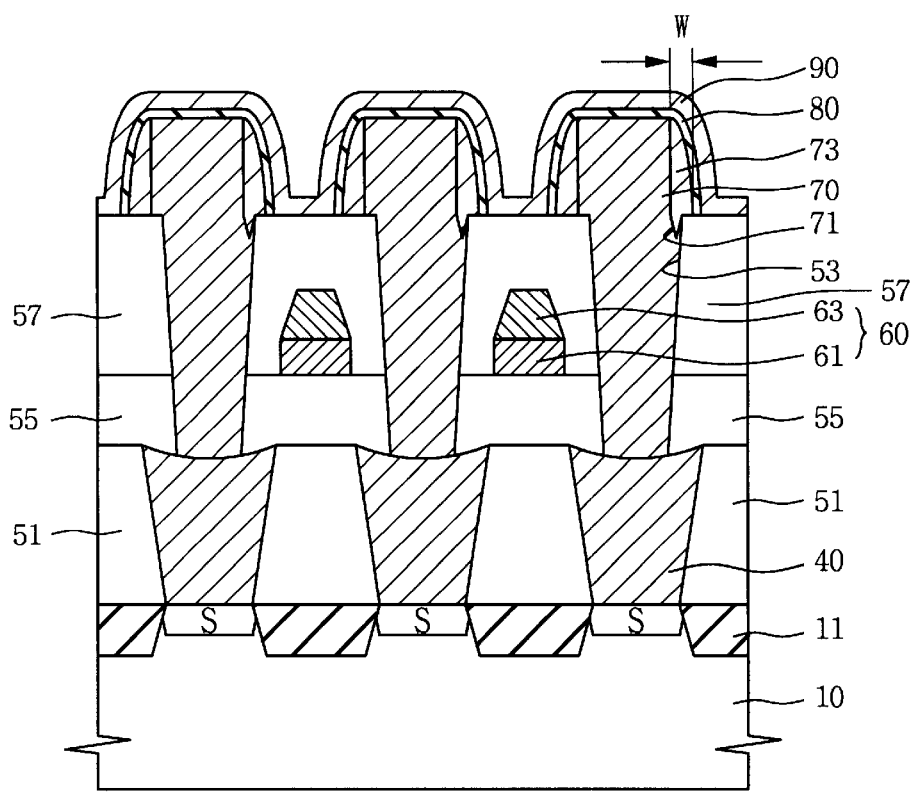

As shown in FIG. 7, after completing formation of the storage electrode, an O/N/O-structured dielectric layer 80 is deposited on the bar pattern 70 of the storage electrode and the spacers 73 to the same thickness. Next, the plate electrode 90 is deposited common to all the storage electrodes with the dielectric layer 80 being between the storage electrodes and the plate electrodes, as indicated, thereby completing all the fabricating processes of the present invention.

Therefore, unlike from the conventional capacitor with a weakness of reduction in the breakdown voltage of the dielectric layer 80 which has been deposited on the bar pattern 70 of the storage electrode having an etched groove 71, even if the etched groove 71 is formed at the bar pattern 70 of the storage electrode, the spacer 73 fills in the etched groove 71 and the dielectric layer 80 is deposited onto the bar pattern 70 of the storage electrode and the spacers 73, thus it is possible to uniformly form the dielectric layer 80 on all the surface of the storage electrode in the same thickness, thereby increasing the breakdown voltage of the dielectric layer 80.

In addition, unlike the prior art, the width of the storage electrode at the top part of the buried contact hole 53 does not get smaller, so that the bar pattern 70 of the storage electrode does not collapse. Also, the buried contact resistance between the bar pattern 70 of the storage electrode and cell pad 40 does not increase in the course of the processes of forming the dielectric layer 80 and the plate electrode 90. As a consequence, the yield of the semiconductor memory devices has been increased in the present invention.

Therefore, there are advantages in the capacitor of the semiconductor memory device and the method for fabricating the capacitor in that the bar pattern of the storage electrode is formed on the interlayer insulating layer by the photo etching process for making an electrical connection with the cell pad through the buried contact hole formed in the interlayer insulating layer, the over-etching process is additionally performed for guaranteeing an electrical separation between storage electrodes, the conductive spacers are formed at both the side walls of the bar patterns of the storage electrodes, the dielectric layer is deposited on the bar pattern of the storage electrode and the conductive spacers, and the plate electrode is deposited over the entire structure.

As a result, even if the storage electrode formed in the buried contact hole is partially exposed due to the misalignment between the bar pattern of the storage electrode and the buried contact hole, causing a etched groove to be formed at the storage electrode exposed by the over-etching process, the conductive spacer fills in the etched groove to thereby increase the breakdown voltage of the dielectric layer of the storage electrode. In addition, in the subsequent processes for forming dielectric layer and plate electrode, the bar pattern of the storage electrode does not collapse and buried contact resistance does not get higher between the bar pattern of the storage electrode and cell pad. The yield of products thereby is improved.

Having described a specific preferred embodiment of the invention, it is to be understood that the invention is not limited to those precise embodiment, and that various changes and modifications may be effected therein by one skilled in the art without departing from the scope or spirit of the invention as defined in the appended claims.

What is claimed is:

1. A capacitor of a semiconductor memory device comprising:
   a substrate having a cell pad exposed through a buried contact hole formed in an interlayer insulating layer;
   a storage electrode having a bar pattern, the storage electrode being formed on the interlayer insulating layer for making an electrical connection with the cell pad through the buried contact hole and conductive spacers formed on the side walls of the storage electrode;
   a dielectric layer formed on the storage electrode; and
   a plate electrode formed on the storage electrodes with the dielectric layer being between the storage electrode including the side spacers and the plate electrode.

2. The capacitor, as defined in claim 1, wherein the spacer is made of a polysilicon layer, the same material as the bar pattern.

3. The capacitor, as defined in claim 1, wherein the spacer is made of a material different from the bar pattern.

4. The capacitor, as defined in claim 1, wherein the width in the bottom of the spacer is more than approximately 60 nm.

5. A capacitor, as defined in claim 1, wherein the storage electrode includes a bar pattern.

6. A method for fabricating a capacitor of a semiconductor memory device, comprising the steps of:
   preparing a substrate having a cell pad;
   forming an interlayer insulating layer having a buried contact hole to expose the cell pad over the substrate;
   forming of a storage electrode extending at least part through the interlayer insulating layer for making an electrical connection with the cell pad through the buried contact hole;
   forming conductive spacers of the storage electrode on the side walls of the storage electrode;
   forming a dielectric layer on the storage electrode; and
   forming a plate electrode on all the storage electrodes with the dielectric layer being between the storage electrode including the side spacers and the plate electrode.

7. The method, as defined in claim 6, wherein the spacer is made of a polysilicon layer, the same material as the bar pattern.

8. The method, as defined in claim 6, wherein the spacer is made of a material different from the bar pattern.

9. The method, as defined in claim 6, wherein the width in the bottom of a spacer is more than approximately 60 nm.

10. A capacitor, as defined in claim 6, wherein the storage electrode includes a bar pattern.

* * * * *